INVENTORS
CLIVE A. P. FOXELL
JOHN G. SUMMERS
BY
Frank R. Jifari
AGENT

INVENTORS
CLIVE A. P. FOXELL
JOHN G. SUMMERS
BY
AGENT 3,443,169
Patented May 6, 1969

3,443,169

SEMICONDUCTOR DEVICE

Clive Arthur Peirson Foxell, Chesman, and John Gilbert Summers, Harrow, England, assignors to North American Philips Company, Inc., New York, N.Y., a corporation of Delaware Filed Aug. 26, 1966, Ser. No. 575,355
Claims priority, application Great Britain, Aug. 26, 1965, 36,655/65
Int. Cl. H01l 3/00, 5/00
U.S. Cl. 317—234 11 Claims

ABSTRACT OF THE DISCLOSURE

A surface-oriented Gunn-effect device is described. In one embodiment, the device is built into a single crystal epitaxial deposit in a cavity of a semi-insulating substrate. In another embodiment, a plurality of such surface-oriented devices built into a common substrate are connected in parallel. In still another embodiment, the surface-oriented Gunn-effect device is combined with a varactor diode or mixer diode by way of a microstrip transmission line to form a microwave integrated circuit.

This invention relates to semiconductor devices known as Gunn effect devices and to microwave integrated circuits incorporating a Gunn effect device.

In an article entitled, "Instabilities of Current in III–V Semiconductors," by J. B. Gunn in I.B.M. Journal of Research and Development, 1964, 8, pages 141–159, there is reported the observation of coherent microwave oscillations from bulk n-type gallium arsenide at a threshold field of 3,000 v./cm.

A Gunn effect device is to be understood to mean herein a semiconductor body or body part of one conductivity type having two ohmic contacts and in which a sufficient voltage applied between the ohmic contacts causes an electron transfer in the conduction band which gives rise to a differential negative resistance.

The operation of a Gunn effect device can be explained in that the electron transfer under a high field is from a high mobility conduction band to a higher energy subband which is of lower mobility. Gunn effect devices are sometimes referred to as transferred electron oscillators but in addition to their use as oscillators they may also be employed as amplifiers.

Devices so far reported and investigated in which the semiconductor material is of n-type gallium arsenide have consisted of a body having ohmic contacts on two opposite surfaces. Whilst it has been found possible to obtain continuous operation at a frequency of about 5 gc./s. with the structure the output is found to be of relatively low power or it has been found necessary to cool the semiconductor body.

With a structure consisting of ohmic contacts situated on two opposite surfaces of a thin wafer-shaped semiconductor body there are inherent power and frequency limitations. For material of a given resistivity the power dissipation per unit volume, under oscillating conditions, is approximately constant. To obtain sufficient cooling to prevent an excessive temperature rise it is necessary to have a relatively high resistance and also have a very thin semiconductor body. For continuous operation a body thickness of 20 microns or less would be desirable but the limitations of fabrication techniques prevent such a structure being obtained readily. As an alternative high resistivity material may be used but with a material such as gallium arsenide it is difficult to grow reproducibly material of the desired optimum resistivity. Furthermore material of such high resistivity gives rise to a low power output.

The oscillation frequency is mainly determined by the thickness of the semiconductor body and the limitations of fabrication techniques in obtaining sufficiently thin bodies also places a limitation on the frequency obtainable. The upper frequency limit is thus about 6–8 gc./s. It is possible to overcome this problem to a certain extent by employing a structure in which the ohmic contacts are applied to opposite surfaces of a body consisting of a low resistivity substrate on which there is a high resistivity epitaxial layer.

According to the invention a Gunn effect device comprises a semiconductor body or body part of one conductivity type having two spaced ohmic contacts situated on one plane surface of the body or body part.

The advantages of such a device reside in that a higher oscillation frequency may be obtained with this geometry due to the relatively narrow separation of the ohmic contacts on the surface which can be achieved by normal fabrication techniques in the semiconductor art. Furthermore with this geometry a higher resistance for material of a given resistivity may be obtained and thus the previously describe disadvantages of power dissipation and cooling are overcome to a certain extent. With existing photoprocessing techniques it is possible to obtain a separation of the ohmic contacts of less than 10 microns and a separation of 1 micron corresponds to oscillation frequencies greater than 30 gc./s.

In a preferred form of a Gunn effect device according to the invention the ohmic contacts are situated on the surface of a layer of semiconductor material deposited from the vapour phase on a substrate. The layer may be epitaxial with the substrate. The layer may be situated in a cavity in the substrate.

According to a further aspect of the invention a Gunn effect device comprises the parallel connection of a plurality of the surface orientated devices, that is the devices having two spaced ohmic contacts situated on the one plane surface, located in a common semiconductor body or body part or located in separate semiconductor body parts on a common substrate. The advantages of such a Gunn effect device comprising the parallel connection of a plurality of surface orientated devices reside, inter alia, in improved thermal dissipation properties. Heat may be conducted more efficiently from a plurality of parallel connected devices than from a single larger device having the equivalent active area since in the device comprising the parallel connection of a plurality of surface orientated devices the substrate area over which the heat can be conducted to a heat sink can be made greater and hence higher power requirements can be achieved with suitable geometrical design.

Such a device may comprise a first metal layer part on the surface of a semiconductor body or body part which forms a first ohmic contact thereto, a plurality of apertures in the first metal layer part each containing a second metal layer part on the surface spaced from the periphery of the aperture and forming a plurality of second ohmic contacts to the semiconductor body within the apertures in the first layer part, the second metal layer parts all being connected in common. A preferred form of this device comprises an insulating layer overlying the first and second metal layer parts and situated on the surface portion between the first and second metal layer parts, the common connection to the second metal layer parts consisting of a further metal layer overlying the insulating layer and situated in apertures in the insulating layer exposing the second metal layer parts. The thickness of the insulating layer between the first metal layer part and the further metal layer must be sufficient to minimise the stray capacitance and thereby constitute a minimum of R.F. coupling. With this structure it is possible to provide substantial leads to the first metal layer part and to the further metal layer which are both of comparatively large area. This overcomes one of the basic difficulties of attaching leads, which will satisfy the power requirements, to a Gunn effect device having a very small active area. The structure is also suitable to forming the device in a so-called "Beam-Lead" configuration in which the metal layers in addition to providing the electrical connection also provide the mechanical connection.

The semiconductor body or body part may be of n-type gallium arsenide. The device may thus comprise a layer of n-type gallium arsenide deposited from the vapour phase on a substrate of semi-insulating gallium arsenide. The layer need not necessaritly be epitaxial with the substrate.

According to a further aspect of the invention there is provided a microwave integrated circuit incorporating a surface orientated Gunn effect device according to the invention and further circuit elements in a common semiconductor body or body part or on a common substrate.

In a preferred form of such an integrated circuit the Gunn effect device is incorporated in or on a semiconductor dielectric substrate having a microstrip transmission line formed by a conductive metal layer on one surface and a metal layer on an opposite surface of the substrate forming a ground plane.

Such a microwave integrated circuit may consist of a mixer circuit in which the Gunn effect device forms a local oscillator input, or may consist of a parametric amplifier in which the Gunn effect device forms a pump source.

In the microwave integrated mixer circuit the semiconductor dielectric may consist of semi-insulating gallium arsenide, the Gunn effect device and at least one Schottky barrier mixer diode being located in islands of n-type gallium arsenide deposited in cavities in the semi-insulating gallium arsenide.

In the microwave integrated parametric amplifier circuit the semiconductor dielectric may consist of semi-insulating gallium arsenide, the Gunn effect device and a varactor diode being located in islands of n-type gallium arsenide deposited in cavities in the semi-insulating gallium arsenide.

Embodiments of the invention will now be described, by way of example, with reference to the diagrammatic drawing filed with the provisional specification and FIGURES 2 to 6 of the accompanying diagrammatic drawings, in which.

Figure 1:
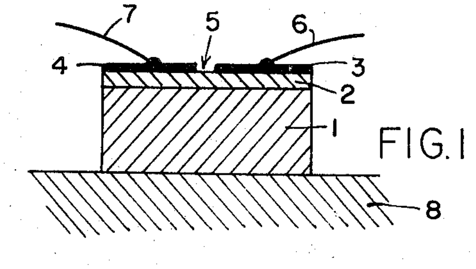
FIGURE 1 is a vertical section of the semiconductor body and part of the envelope of a first embodiment of a Gunn effect device.

The device of FIGURE 1 comprises a substrate 1 of semi-insulating gallium arsenide of dimensions 100 microns x 100 microns x 100 microns thickness. On the substrate there is a layer 2 of n-type gallium arsenide of 10 ohm-cm. resistivity and of about 10 microns thickness. On the upper plane surface of the layer there are two ohmic contacts 3 and 4 consisting of a vapour deposited gold, silver and germanium alloy which has been alloyed to the underlying gallium arsenide. The contacts cover the upper surface with the exception of a thin strip 5 of 10 microns width. Gold wires 6 and 7 have one end thermocompression bonded to the ohmic contacts 3 and 4 respectively. The composite body is encapsulated in a metal-ceramic envelope consisting of an annular ceramic member situated between a metal end pin and an annular metal flange to which a metal end cap is welded. The substrate 1 is mounted on the inner end 8 of the metal pin and contact between the pin and the ohmic contact 3 is via the wire 6 which is thermocompression bonded at its other end to the pin. Contact from the annular metal flange to the ohmic contact 4 is via the wire 7 which is thermocompression bonded at its other end to the flange.

The manufacture of the device involves the conventional techniques of epitaxial deposition of n-type gallium arsenide on a large area substrate of semi-insulating gallium arsenide, vapour deposition of the ohmic contact material followed by photoprocessing to leave the two contacts 3 and 4 with the separation strip 5, alloying the ohmic contact material to the underlying parts of the layer, dicing of the substrate into smaller wafers, mounting a smaller slice on a part of the envelope, thermocompression bonding the wires 6 and 7 and final sealing of the envelope.

Figure 2:
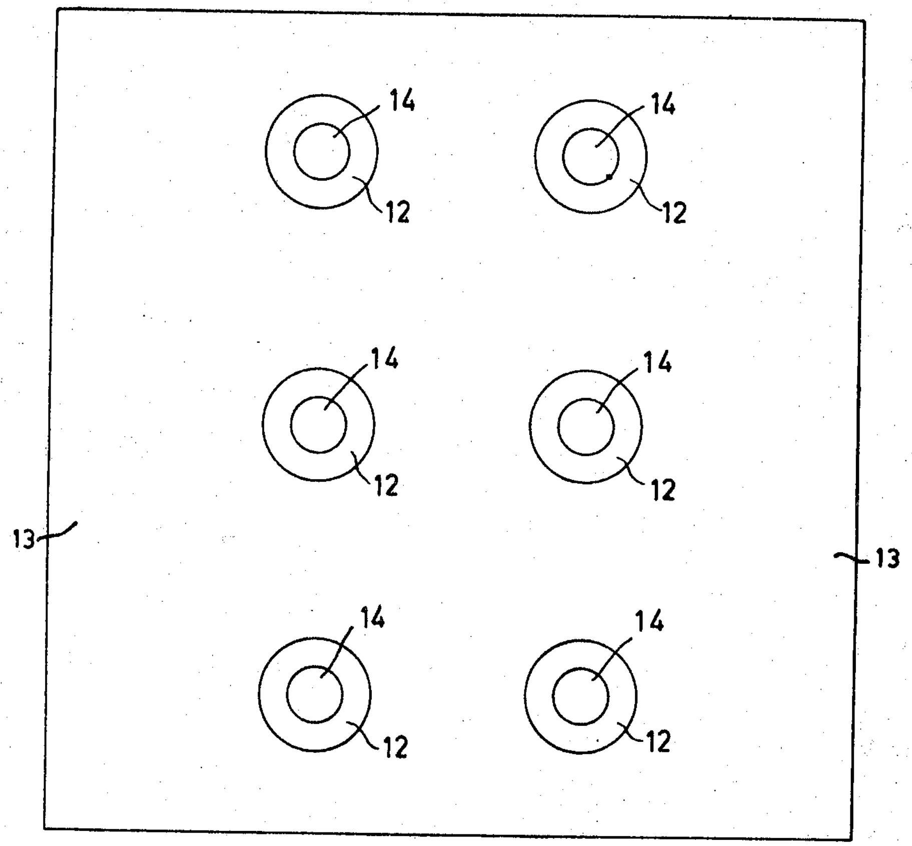
FIGURES 2 and 3 show a second embodiment of a Gunn effect device, FIGURE 2 showing a plan view of the contact configuration on the surface of the semiconductor body during an intermediate stage in the manufacture of the device and FIGURE 3 showing a vertical section through the semiconductor body at a later stage in the manufacture of the device.
Figure 3:
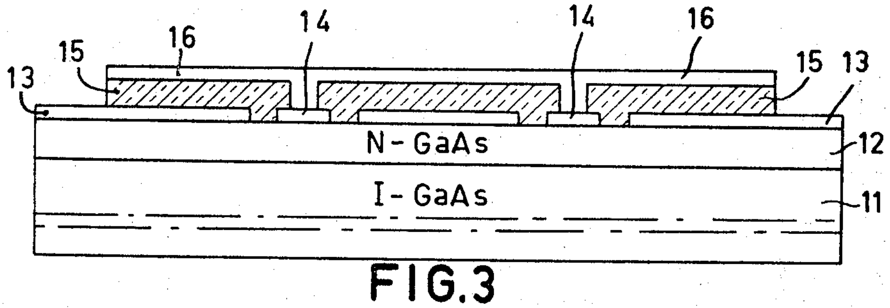

The device of FIGURES 2 and 3 comprises a substrate 11 of semi-insulating gallium arsenide of dimensions 400 microns x 600 microns x 100 microns thickness. On the substrate 11 there is a layer 12 of n-type gallium arsenide of 10 Ω-cm. resistivity and about 10 microns thickness. On the upper plane surface of the layer 12 there is a vapour deposited metal layer of gold/tin having a first metal layer part 13 within which six annular apertures are located and each containing a second metal layer part 14. The diameter of the parts 14 is 20 microns and the separation of the adjacent circular edges of the parts 13 and 14 is 10 microns. The six annular portions of the surface of the n-type gallium arsenide and the underlying material layer 12 constitute the active regions of six surface orientated Gunn effect devices. An insulating layer 15 of silicon dioxide glass and of 50 microns thickness is situated overlying the first and second metal layer parts 13 and 14 and situated on the surface of the layer 12 occupying the annular portions between the metal layer parts 13 and 14. Apertures in the glass layer 15 situated above the metal layer parts 14 contain a further metal layer 16 of chromium and gold which also extends over the glass layer 15. At the periphery of the body the metal layer part 13 is exposed for contacting purposes. The contacts may consist of wires bonded to the metal layer 16 and to the exposed part of the metal layer 13.

Figure 4:
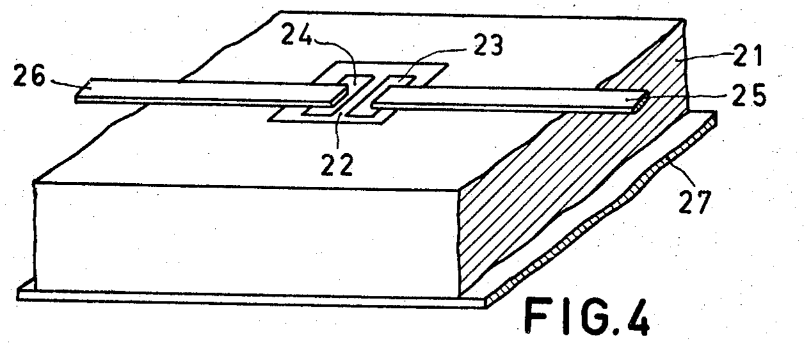
FIGURES 4 and 5 are a perspective view and vertical section respectively of a further embodiment in which a Gunn effect device is incorporated in a microwave integrated circuit.
Figure 5:
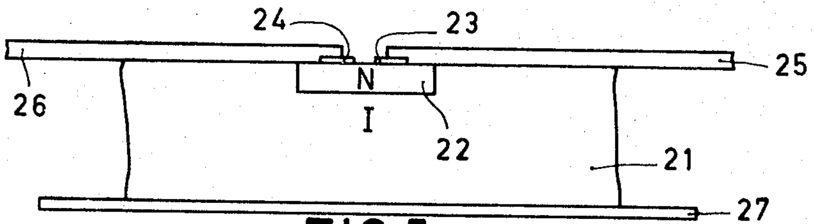

FIGURES 4 and 5 show the incorporation of a surface orientated Gunn effect device in a microwave integrated circuit. The substrate body consists of a plate-shaped body 21 of semi-insulating gallium arsenide of 300 microns thickness. The Gunn effect device is located in a layer 22 of high resistivity n-type gallium arsenide which has been deposited from the vapour phase in a cavity in the substrate 21. Ohmic contacts 23 and 24 to the layer 22 are situated on the upper plane surface of the layer 22 and the dimensions and composition of the various parts of the device are substantially similar to those of the device described with reference to FIGURE 1. A microstrip transmission line is formed by strips 25 and 26 of chromium and gold of 250 microns width and 10 microns thickness which are alloyed at their adjacent ends to the ohmic contacts 23 and 24 respectively, and a metal layer 27 of chromium and gold of 10 microns thickness which extends over the whole area of the opposite plane surface of the substrate 21 and serves as a ground plane. Depending on the exact form of the integrated circuit, other active circuit elements, for example Schottky barrier diodes and varactor diodes are incorporated in further deposited layers of gallium arsenide in cavities in the semi-insulating gallium arsenide substrate 21.

Figure 6:
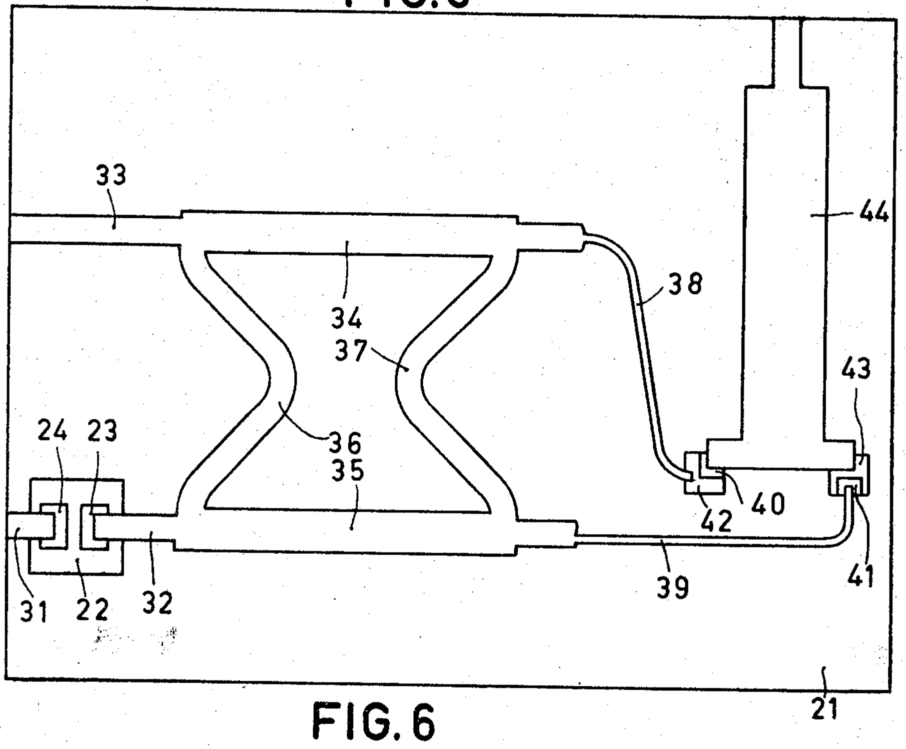
FIGURE 6 is a plan view of the surface configuration of the semiconductor body of an embodiment of a microwave integrated mixer circuit.

FIGURE 6 shows the surface configuration of an X-band integrated mixer circuit embodying a Gunn effect device and microstrip transmission line as described with reference to FIGURE 5. The mixer circuit comprises a substrate 21 of semi-insulating gallium arsenide. On the lower surface there is a chromium and gold layer 27 forming a ground plane of a microstrip transmission line. A surface orientated Gunn effect device is formed by an island of n-type gallium arsenide 22 deposited in a cavity in the substrate having two surface ohmic contacts 23 and 24. This Gunn effect device forms the local oscillator and hence replaces a conventional local oscillator which would normally be constituted by either a klystron or a varactor multiplier. The drive to the Gunn oscillator is through a D.C. supply applied to metal layer parts 31 and 32 on the surface. The signal input of the circuit is to a conductive metal layer part 33. The Gunn oscillator and the signal input precede a 3 db coupler consisting of a branch type hybrid formed by conductive metal layer parts 34, 35, 36 and 37 and followed by one-quarter wavelength matching transformer sections formed by high impedance metal layer line parts 38 and 39. The parts 38 and 39 are connected to metal/semiconductor Schottky barrier diodes 40 and 41 respectively. The diodes 40 and 41 are located in islands 42 and 43 respectively of n-type gallium arsenide deposited in a cavity in the substrate. The diodes are connected to the metal layer parts 38 and 39 one reversed with respect to the other and further connected to a matching section formed by a metal layer part 44 for the I.F. output.

What we claim is:

1. A Gunn-effect device comprising a high-resistivity single crystal substrate of semiconductive material having a surface, a single crystal deposit formed in said surface and terminating thereon and crystallographically related to the substrate, said deposit being of lower-resistivity semiconductive material and having a plane surface, and two spaced ohmic contacts on the said plane surface of said deposit.

2. A device as set forth in claim 1 wherein a large area ohmic contact is made to the surface of the substrate opposite to that containing the deposit, said ohmic contact constituting a ground plane.

3. A Gunn-effect device comprising a common substrate, plural spaced regions of said substrate being constituted of semiconductive material, said regions having plane surfaces all lying in a common plane, two spaced ohmic contacts on the plane surface of each of said regions, first means for interconnecting all of one of said contacts, and second means for interconnecting all of the other of said contacts, whereby said contacted regions are connected in a parallel arrangement.

4. A device as set forth in claim 3 wherein the first means comprises a single metal layer on and having apertures over each of said regions, plural metal deposits are provided each within one of said apertures and spaced from the single metal layer, said second means constituting a common connection to the plural metal deposits.

5. A device as set forth in claim 4 wherein an insulating layer is provided over the single metal layer and part of the plural metal deposits, and the second means constitutes a metal layer on the insulating layer contacting uncovered parts of each of the metal deposits.

6. A device as set forth in claim 3 wherein said substrate comprises a high resistivity single crystal of semiconductive material having on a plane surface thereof a single crystal layer of lower-resistivity semiconductive material also having a plane surface, said plural spaced regions being regions of said single crystal layer.

7. A microwave integrated circuit comprising a common dielectric substrate; a Gunn-effect device on said substrate, said Gunn-effect device comprising a region of said substrate of semiconductive material at a first surface of said substrate and having a plane surface and two spaced ohmic contacts on the said plane surface; a metal layer on the opposite surface of said substrate forming a ground plane; a conductive metal layer on the first surface of said substrate forming a microstrip transmission line with said ground plane; said last-named conductive metal layer being electrically connected to at least one of the spaced ohmic contacts of the Gunn-effect device.

8. A microwave integrated circuit as set forth in claim 7 wherein the substrate is a semi-insulating semiconductive material, and at least one Schottky barrier mixer diode is mounted on the substrate and connected to the microstrip transmission line.

9. A microwave integrated circuit as set forth in claim 8 wherein the substrate is of gallium arsenide having cavities therein and within the cavities n-type regions of gallium arsenide, the n-type regions having planar surfaces coplanar with each other and with the substrate surface, the Gunn-effect device being built into one of the n-type regions, the mixer diode being built into another of the n-type regions.

10. A microwave integrated circuit as set forth in claim 8 wherein the substrate is of gallium arsenide having formed within a surface thereof n-type regions of gallium arsenide, the n-type regions having planar surfaces coplanar with each other and with the substrate surface, the Gunn-effect device being built into one of the n-type regions, the mixer diode being built into another of the n-type regions.

11. A microwave integrated circuit as set forth in claim 29 wherein the substrate is of gallium arsenide having formed within a surface thereof n-type regions of gallium arsenide, the n-type regions having planar surfaces coplanar with each other and with the substrate surface, the Gunn-effect device being built into one of the n-type regions, the varactor diode being built into another of the n-type regions.

References Cited

UNITED STATES PATENTS

| | | | |
|---|---|---|---|
| 2,858,489 | 10/1958 | Henkels | 317—234 |
| 3,065,391 | 11/1962 | Hall | 317—234 |
| 3,290,753 | 12/1966 | Chang | 317—235 |
| 3,322,581 | 5/1967 | Hendrickson et al. | 317—235 |
| 3,359,504 | 12/1967 | Bento et al. | 317—235 |
| 3,365,583 | 1/1968 | Gunn | 317—234 |

OTHER REFERENCES

The Microwave Journal, Microwave Solid-State Oscillators, March 1966, pages 40–46.

JOHN W. HUCKERT, *Primary Examiner.*

J. D. CRAIG, *Assistant Examiner.*

U.S. Cl. X.R.

331—107